June 10, 1969 T. H. BLADEN 3,449,686
VARIABLE GAIN AMPLIFIER
Filed May 29, 1967
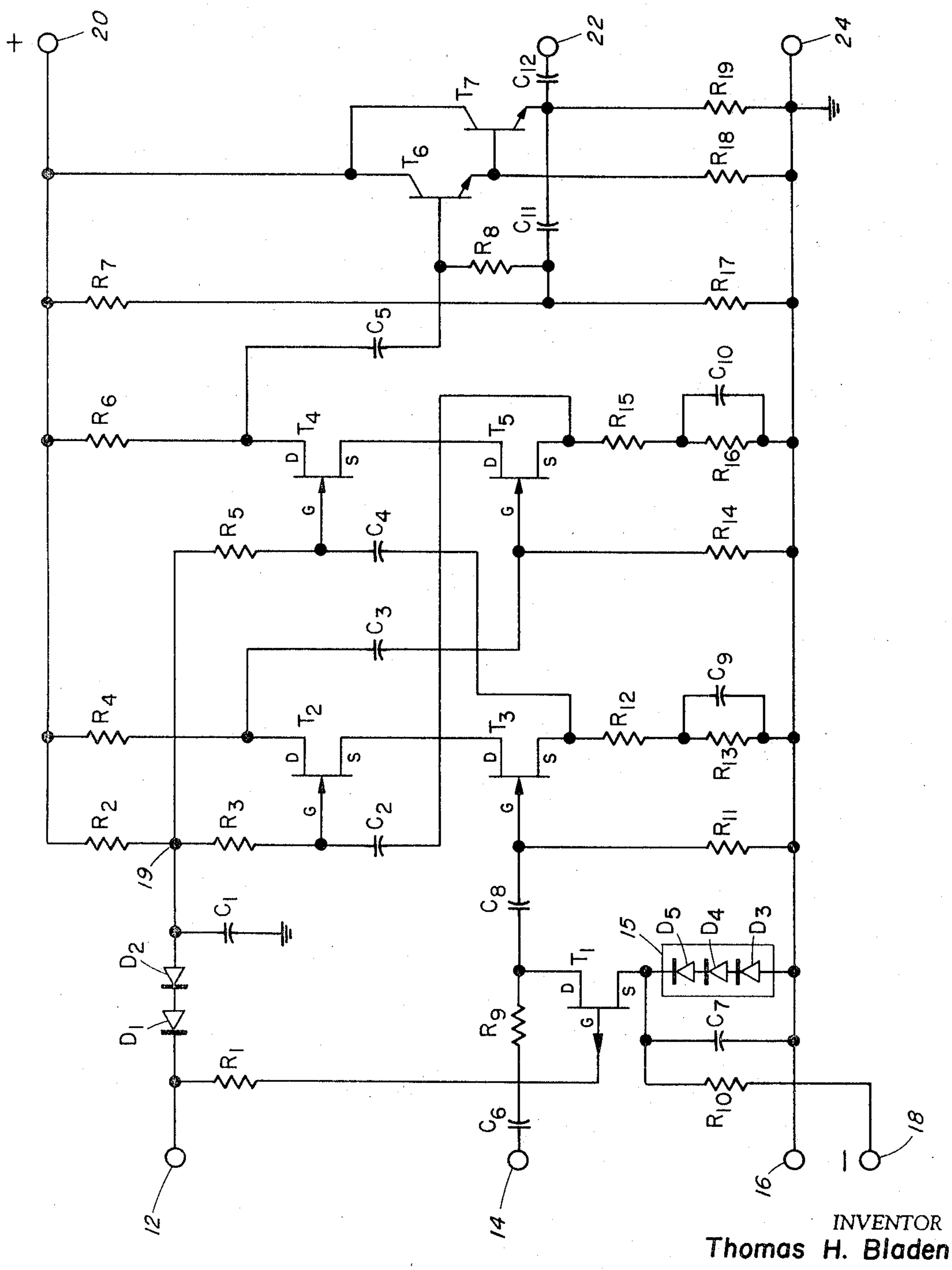
INVENTOR
Thomas H. Bladen
BY J. O. Tresansky
ATTORNEY
H R Booker
AGENT

3,449,686
VARIABLE GAIN AMPLIFIER

Thomas H. Bladen, Adelphi, Md., assignor to the United States of America as represented by the Secretary of the Navy Filed May 29, 1967, Ser. No. 644,431
Int. Cl. H03g *3/30;* H03f *1/34*
U.S. Cl. 330—29 4 Claims

ABSTRACT OF THE DISCLOSURE

A variable gain amplifier having field effect transistors as the active elements providing a wide automatic gain control range greater than 100 db. A voltage variable attenuator connects broad band input signals to variable gain cascode connected amplifier stages, an automatic gain control signal controls the field effect transistors over a wide dynamic range, and feedback arrangement between the cascode stages maintains amplifier stability.

*Background of the invention*

The invention relates generally to variable gain amplifiers and more specifically to variable gain voltage amplifiers operable over a wide dynamic range.

Variable voltage gain amplifiers are well known in the art but in the past have been limited to ranges determined by the characteristics of the active elements which have usually been vacuum tubes. Vacuum tubes provide satisfactory gain control over relatively narrow ranges, but are found to be completely unsatisfactory for wide dynamic ranges on the order of 100 db.

A feature of this invention is the incorporation of field effect transistors into a variable gain amplifier. The field effect transistor includes, for example, a gate electrode, a source electrode, and a drain electrode. Several characteristics of the field effect transistor make it a desirable active element for a variable gain amplifier. The field effect transistor is operable in a wide frequency band and provides an amplification of signals of relatively high frequency with a suitable gain. Because the input approximates the resistance of a reversed biased diode, it exhibits high input impedance as compared with the usual transistor and functions very similarly to that of a vacuum tube pentode. Another desirable feature of field effect transistors is their low self noise characteristics.

Several problems arise however in the incorporation of field effect transistors into a very wide range voltage gain amplifier. At high audio frequencies on the order of 10 to 20 kc., a very noticable "Miller effect" capacity amplification occurs. This effect may be reduced by cascode connection of amplifiers, but high frequency response is still difficult to achieve with amplifier stages without the introduction of some signal attenuation. The use of signal attenuation for high frequencies, however, can seriously distort the output signals for large input signal amplitudes. Overall amplifier stability is also a serious problem and must be eliminated for satisfactory performance over a wide AGC range up to and greater than 100 decibels.

*Summary of the invention*

The general purpose of the invention is to provide a wide dynamic range variable gain voltage amplifier for a broad band of audio frequencies.

It is an object of the present invention to provide an improved variable gain amplifier.

Another object of the invention is the provision of a variable gain amplifier having field effect transistor active elements.

The above and other objects are attained by a novel circuit arrangement of field effect transistor voltage variable attenuator and variable gain cascode connected field effect transistor amplifier stages. The voltage variable attenuator receives the signal input and passes it to the field effect transistor cascode amplifier stages which then provides a constant output signal. An automatic gain control voltage provides a control voltage to the gates of the field effect transistors in both the attenuator and amplifier stages so that a wide dynamic voltage range is achieved for an input signal from broad frequency band. Feedback between cascode stages in the variable gain amplifier stages give the circuit the necessary stability. The present device is therefore a low noise, solid state variable gain amplifier which is very useful in applications where a wide dynamic range is desirable.

*Brief description of the drawing*

The foregoing and other objects, features and attendant advantages of the invention will be readily appreciated as the same becomes better understood by reference to the accompanying drawing wherein:

The sole figure is an electrical circuit diagram of a field effect transistor variable gain amplifier.

*Description of the preferred embodiment*

The figure illustrates an embodiment of the invention which comprises a voltage variable input signal attenuator, two cascode connected variable gain amplifier stages and an impedance-matching output emitter follower. A single AGC D.C. control signal controls both the attenuating and gain of signals in achieving a wide range of possible gain.

An input signal is applied across terminals 14 and 16. Terminal 16 is connected to ground in the usual manner. The automatic gain control signal is applied across terminals 12 and 16. The input signal may be a frequency signal anywhere in the audio range.

A signal applied across terminals 14 and 16 has an A.-C. path through capacitor $C_6$, resistor $R_9$ and capacitor $C_8$ to the gate electrode of the field effect transistor $T_3$. A voltage variable attenuator employing a "P" channel field effect transistor $T_1$ is connected across the amplifier input resistor $R_{11}$. The field effect transistor $T_1$ attenuates large signals sufficient to overload the amplifier stages by operating as a voltage divider to drop input voltages across resistor $R_9$ when the impedance of the field effect transistor $T_1$ is lowered by negative AGC signals applied across resistor $R_1$ to the gate electrode of transistor $T_1$. The resistor $R_9$ may, for example, has a resistance of 51 kilo-ohms.

As the AGC signal becomes more positive, the attenuation is decreased as less voltage is dropped across resistor $R_9$ by transistor $T_1$.

The entire attenuator circuit is biased to a predetermined level at the source electrode of transistor $T_1$ by stabistor reference diodes 15, capacitor $C_7$ and resistor $R_{10}$. Stabistor diode 15, consisting of series connected silicon diodes $D_3$, $D_4$ and $D_5$, maintains, for example, a voltage level of $-2$ volts across capacitor $C_7$ when a biasing battery of $-20$ volts is applied between terminals 16 and 18. The resistor $R_{10}$ may, for example, have a resistance of 4300 ohms while the capacitor $C_7$ may have a capacitance of 10 micro-farads. The stabistor diode 15 establishes the proper bias level thus allowing the attenuation to always operate in conjunction with the amplifier AGC voltage and maintain undistorted output signals with large input signal amplitudes.

The first and second amplifier stages field effect transistors $T_2$, $T_3$, $T_4$ and $T_5$ all have "N" type semiconductor channels. With "N" type channels a positively increasing signal at the gate electrodes of transistors $T_2$ and $T_4$ turns the amplifier stages on, thus increasing the source-drain current flow through the transistors. The first amplification stage comprises field effect transistors $T_2$ and $T_3$ which are cascode connected to reduce the "Miller effect" capacity amplification and improve high frequency response. In the first stage, for example, high frequencies cause capacity amplification between the gate and drain electrodes and source and gate electrodes of field effect transistor $T_3$. With the source electrode of transistor $T_2$ connected to the drain electrode of transistor $T_3$, changes in the drain electrode potential at transistor $T_3$ are corrected by the potential at the source electrode of transistor $T_2$.

The input A.C. signal is applied across resistor $R_{11}$ to the common source field-effect transistor $T_3$ while the automatic gain control D.C. signal is applied across resistor $R_3$ to the input of common-gate transistor $T_2$ and resistor $R_5$ to the input of common-gate transistor $T_4$.

A power supply voltage is applied to resistor $R_2$ to provide forward bias current through diodes $D_1$ and $D_2$. The positive D.C. source, which may be for example, 20 volts also provides voltage for both the amplifier stages and the emitter follower network. Transistor $T_2$ has the drain electrode connected to the positive D.C. source through resistor $R_4$.

An output A.C. signal is developed across the common-gate load resistor $R_4$ from the current flow from the drain electrode of transistor $T_2$ through capacitor $C_3$ to the gate electrode of field effect transistor $T_5$.

The second stage field effect cascode amplification stage operates in the same manner as the first stage. The A.C. signal is applied to the gate of common-source transistor $T_5$ which is cascode connected with its drain electrode connected to the source electrode of common-gate transistor $T_4$. The drain electrode is also connected to a positive D.C. source through resistor $R_6$. The A.C. amplified output current signal passes through capacitor $C_5$ to the base of transistor $T_6$. Resistor $R_8$, $R_7$ and $R_{17}$ provides D.C. forward bias to transistors $T_6$ and $T_7$.

To maintain stability in the amplified voltage signal, A.C. negative feedback is provided from the source electrode of transistor $T_5$ through capacitor $C_2$ to the AGC input of transistor $T_2$ and A.C. negative feedback is supplied through capacitor $C_4$ connected between the source electrode of transistor $T_3$ and the AGC input of transistor $T_4$. These feed back signals act to reduce the amplifier stage gain and unstable operating conditions.

A fixed resistor $R_{12}$ and an RC network comprising resistor $R_{13}$ and capacitor $C_9$ are connected in series with the common-source field effect transistor $T_3$. The resistor and RC network act to provide additional negative feed back and provide temperature and high frequency response compensation in the usual manner. For the same reasons, resistor $R_{15}$ and RC network comprising resistor $R_{16}$ and capacitor $C_{10}$ are connected in series with the source electrode of transistor $T_5$.

Silicon diode $D_1$ and silicon diode $D_2$ are connected in series between resistors $R_3$ and $R_5$ and the AGC source. The diodes serve to establish an optimum AGC operating level between the attenuator and amplifier stages. A capacitor $C_1$ is connected between the silicon diodes and ground to filter out spurious high frequency signals.

After passing through the amplifier stages, the amplified output signal is applied to the input of an emitter-follower network of the "Darlington" type. The emitter-follower network comprises two transistors $T_6$ and $T_7$ with a boot strap connection from the output to the input voltage divider. The emitter of transistor $T_6$ is connected to ground through resistor $R_{18}$ and the emitter of transistor $T_7$ is connected to ground through resistor $R_{19}$.

A voltage divider network comprising resistors $R_7$ and $R_{17}$ provide D.C. bias voltage. The amplifier output voltage appears as a constant rms voltage across the resistor $R_8$. A positive feedback signal from the emitter of transistor $T_7$ through capacitor $C_{11}$ to the voltage divider cancels the input resistance effect.

The emitter follower output voltage signal is taken off terminals 22 and 24 across load resistor $R_{19}$ and capacitor $C_{12}$. Essentially the output signal is unchanged from that of the constant rms signal appearing at the output of the amplifier stages, but the emitter-follower stage provides a low impedance amplifier output which may be connected to a rectifier circuit or other low input impedance devices.

In achieving variable gain amplification for a range as great or greater than 100 decibels, the variable amplifier can account for approximately 70 decibels or a little more gain while the variable input signal attenuation accounts for up to —30 decibels of attenuation. Together the voltage variable attenuator and the variable gain cascode amplifier stages can achieve a range of more than 100 decibels.

The invention provides, therefore, amplified undistorted signals for widely varying audio frequency input signals and is capable of operation within a very wide variation in dynamic range. This is achieved by combining a field effect transistor variable voltage attenuator with field effect transistor variable gain amplifier stages and simultaneously controlling both the amplifier stages gain and the attenuator's attenuation by a single automatic gain control. High stability within the wide gain range is maintained and signal distortions are eliminated. Undesirable temperature effects and noise are held to a minimum while high frequency response is achieved.

While a particular embodiment of the invention has been shown and described, modifications may be made.

What is new and desired to be secured by Letters Patent of the United States is:

1. A variable gain voltage amplifier comprising a first amplifier stage and a second amplifier stage, input signal circuit means, automatic gain control circuit means, and output signal circuit means, each of said stages having a common-gate field effect transistor and a common-source field effect transistor, each of said transistors having gate, drain, and source electrodes, the drain electrodes of the common-source transistors connected to the source electrodes of the common-gate transistors within their respective stages, said input means connected to the gate of the first stage common source transistors, said drain electrode of the first stage common-gate transistor coupled to the gate elecvtrode of the second stage common-source transistor, said automatic gain control circuit means connected to the gate electrodes of the common-gate transistors in both of said stages, the drain electrode of the second stage common-gate transistor connected to said output circuit means, each of the source electrodes of the common-source transistors in each stage coupled to the gate electrodes of the common gate transistors of the other stage.

2. A variable gain voltage amplifier having input circuit means, automatic gain control means, an attenuator having an input connected to said input circuit means and said automatic gain control means and having an output therefrom, first and second amplifier stages each having a field effect control transistor connected to said gain control means and a field effect signal input transistor, the signal input transistor of said first stage coupled to said signal input means, the signal input transistor of said first stage connected to the output of said attenuator and the signal input transistor of said second stage connected to the control transistor of the first stage, said amplifier network further comprising first and second feedback circuits coupling the first stage to the second stage, each of said feedback circuits connecting the signal input transistor of one stage to the control transistor of the other stage.

3. A variable gain voltage amplifier comprising:

input circuit means for receiving an applied variable frequency input signal;

control circuit means for receiving an automatic gain control signal;

a field effect transistor voltage variable attenuator having an input connected to said input circuit means and an input connected to said control circuit means;

a field effect transistor variable gain amplifier network having an input connected to said control circuit means, an input connected to the output of said variable attenuator, and output circuit means connected to said amplifier network for providing an amplified output signal; said variable gain amplifier network including a first amplifier stage comprising cascoded field effect transistors, a second amplifier stage comprising cascoded field effect transistors, and means for connecting said first stage to said second stage and wherein each of said cascoded field effect transistors of said amplifier stages include a field effect control transistor connected to said automatic gain control circuit and a field effect signal input transistor, the signal input transistor of said first stage being connected to said attenuator output and wherein said means for connecting includes connecting the signal input transistor of said second stage to the control transistor of the first stage and connecting the first stage to the second stage by connecting the signal input transistor of each stage to the control transistor of the other stage through respective first and second feedback circuits.

4. The amplifier of claim 3 wherein said signal input transistors are common-source field effect transistors and said control transistors are common-gate field effect transistors, the gate electrodes of said control transistors coupled to said automatic gain control circuit, the gate electrode of the first stage common source transistor coupled to the attenuator output, the signal connecting means between the first stage common-gate transistor having its drain electrode coupled to the gate electrode of the second stage common source transistor, the source electrode of said second stage common-source transistor coupled in feedback circuit to the gate of said first stage common-gate electrode, the source electrode of the first stage common-source electrode coupled to the gate electrode of said second stage common-gate transistor, and the output circuit connected to the drain electrode of said second stage common-gate electrode.

References Cited

UNITED STATES PATENTS

| | | | |
|---|---|---|---|
| 2,243,423 | 5/1941 | Hollingsworth ---- | 330—145 X |
| 3,229,218 | 1/1966 | Sickles et al. -------- | 330—29 |

OTHER REFERENCES

"Cascode Field Effect Transistor Applications," Technical Notes No. 5 of Amelco Semiconductor, page 9, Oct. 31, 1963.

ROY LAKE, *Primary Examiner.*

J. B. MULLINS, *Assistant Examiner.*

U.S. Cl. X.R.

330—28, 35, 133, 145